US011049845B2

United States Patent
Ohba et al.

(10) Patent No.: US 11,049,845 B2
(45) Date of Patent: Jun. 29, 2021

(54) SEMICONDUCTOR DEVICE HAVING WIRES CONNECTING CONNECTION PADS

(71) Applicant: PS5 Luxco S.a.r.l., Luxembourg (LU)

(72) Inventors: Takashi Ohba, Tokyo (JP); Yoshihiro Sato, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 273 days.

(21) Appl. No.: 14/428,207

(22) PCT Filed: Sep. 4, 2013

(86) PCT No.: PCT/JP2013/074445
§ 371 (c)(1),
(2) Date: Mar. 13, 2015

(87) PCT Pub. No.: WO2014/042165
PCT Pub. Date: Mar. 20, 2014

(65) Prior Publication Data
US 2015/0235994 A1    Aug. 20, 2015

(30) Foreign Application Priority Data

Sep. 14, 2012    (JP) .............................. JP2012-202776

(51) Int. Cl.
*H01L 23/495*    (2006.01)
*H01L 23/02*    (2006.01)
(Continued)

(52) U.S. Cl.
CPC ........ *H01L 25/0657* (2013.01); *H01L 21/561* (2013.01); *H01L 21/565* (2013.01);
(Continued)

(58) Field of Classification Search
CPC ................. H01L 25/0657; H01L 25/50; H01L 2225/0651; H01L 2225/06562;
(Continued)

(56) References Cited

U.S. PATENT DOCUMENTS

| | | | | |
|---|---|---|---|---|
| 6,563,205 B1* | 5/2003 | Fogal | ...................... | H01L 24/49 257/777 |
| 2012/0319294 A1* | 12/2012 | Lee | ...................... | H01L 23/3135 257/774 |
| 2013/0069245 A1* | 3/2013 | Uchiyama | ............... | H01L 24/24 257/774 |

FOREIGN PATENT DOCUMENTS

| JP | 2001077293 | 3/2001 |
|---|---|---|
| JP | 3096721 | 7/2003 |
| JP | 2011233915 | 11/2011 |

OTHER PUBLICATIONS

Application No. PCT/JP2013/074445, International Search Report, dated Nov. 12, 2013.

* cited by examiner

*Primary Examiner* — Kimberly N Rizkallah
*Assistant Examiner* — Dilinh P Nguyen

(57) ABSTRACT

A semiconductor device comprises the following: a wiring substrate having on one side a recessed section and a plurality of connection pads; a first semiconductor chip mounted in the recessed section; a second semiconductor chip that has a plurality of electrode pads on the surface of at least one end section (in this case, both ends) and that is laminated onto the first semiconductor chip so that at least one end section (in this case, both ends) protrudes from the first semiconductor chip; a plurality of wires that mutually and electrically connect the plurality of connection pads of the wiring substrate and the plurality of electrode pads of the second semiconductor chip. One end section of the second
(Continued)

semiconductor chip extends beyond the inner surface of the recessed section and is supported by one side of the wiring substrate.

6 Claims, 11 Drawing Sheets

(51) Int. Cl.
    *H01L 23/48*     (2006.01)
    *H01L 23/52*     (2006.01)
    *H01L 25/065*     (2006.01)
    *H01L 21/56*     (2006.01)
    *H01L 23/00*     (2006.01)
    *H01L 23/498*     (2006.01)
    *H01L 23/13*     (2006.01)
    *H01L 25/00*     (2006.01)
    *H01L 23/31*     (2006.01)

(52) U.S. Cl.
    CPC ........ H01L 23/13 (2013.01); H01L 23/49822 (2013.01); H01L 24/97 (2013.01); H01L 25/50 (2013.01); *H01L 23/3128* (2013.01); *H01L 23/49816* (2013.01); *H01L 24/73* (2013.01); *H01L 2224/0401* (2013.01); *H01L 2224/04042* (2013.01); *H01L 2224/06155* (2013.01); *H01L 2224/16225* (2013.01); *H01L 2224/32145* (2013.01); *H01L 2224/32225* (2013.01); *H01L 2224/48227* (2013.01); *H01L 2224/49175* (2013.01); *H01L 2224/73253* (2013.01); *H01L 2224/73265* (2013.01); *H01L 2224/85181* (2013.01); *H01L 2224/85205* (2013.01); *H01L 2224/92247* (2013.01); *H01L 2224/97* (2013.01); *H01L 2225/0651* (2013.01); *H01L 2225/06517* (2013.01); *H01L 2225/06558* (2013.01); *H01L 2225/06562* (2013.01); *H01L 2225/06568* (2013.01); *H01L 2924/15153* (2013.01); *H01L 2924/15311* (2013.01); *H01L 2924/181* (2013.01)

(58) Field of Classification Search
    CPC ......... H01L 2225/06568; H01L 25/117; H01L 25/043; H01L 25/074; H01L 25/0756; H01L 27/3209; H01L 23/49503; H01L 23/4951; H01L 25/041; H01L 25/065; H01L 25/07; H01L 25/165
    USPC ................................ 257/676, 686, 777, 778
    See application file for complete search history.

SEMICONDUCTOR DEVICE HAVING WIRES CONNECTING CONNECTION PADS

TECHNICAL FIELD

The present invention relates to a semiconductor device and a method for producing a semiconductor device.

BACKGROUND

In order to increase the density of semiconductor devices, a plurality of semiconductor chips are stacked one over another. Such a semiconductor device is sometimes known as an MCP (Multi Chip Package).

An MCP-type semiconductor device is normally required to have what is known as an overhanging portion, in which a portion of an upper-level semiconductor chip protrudes out from a lower-level semiconductor chip, to allow for wire bonding.

Coupled with reductions in the thickness of semiconductor chips, such overhanging portions cause chip cracks, warping and the like during subsequent wire bonding or resin sealing processes, and thus a structure is needed to reinforce the overhanging portion.

A known structure of this kind is a structure in which a bonding wire is disposed directly below the overhanging portion as a supporting portion (patent literature article 1).

Further, use is also made of structures in which a bump provided directly below the overhanging portion serves as a supporting portion (patent literature articles 2 and 3).

Moreover, there is also a known structure in which, by disposing an adhesive on a wiring substrate and using flip-chip mounting for a first semiconductor chip, and by making the adhesive protrude outside of the first semiconductor chip, the overhanging portion of a second semiconductor chip is supported by the protruding adhesive (patent literature article 4).

PATENT LITERATURE

Patent literature article 1: Japanese Patent Kokai 2011-086943

Patent literature article 2: Japanese Patent Kokai 2009-194189

Patent literature article 3: Japanese Patent Kokai 2009-099697

Patent literature article 4: Japanese Patent Kokai 2000-299431

SUMMARY OF THE INVENTION

Problems to be Resolved by the Invention

As described above, various structures have been proposed as structures for reinforcing the overhanging portion, but there is still scope for improvement from the point of view of improving the reliability of the semiconductor device.

For example, with a structure in which the overhanging portion is supported using a supporting member comprising a bump or a bonding wire, as described in patent literature articles 1 to 3, there are sections of the overhanging portion that are supported by the supporting member and sections that are not supported, and thus the thinner the upper-level semiconductor chip, the greater the risk that it will not be possible to achieve satisfactory wire bonding.

Further, with a structure in which the overhanging portion is supported using adhesive that protrudes outside of the chip, as in patent literature article 4, if the amount of protrusion of the adhesive is insufficient, there is a risk that it will not be possible for the gap between the upper-level chip and the substrate to be filled using the adhesive.

There is thus a demand for a semiconductor device in which the overhanging portion can be securely supported.

Means of Overcoming the Problems

A first mode of embodiment of the present invention relates to a semiconductor device having: a wiring substrate having, on one surface, a recessed portion and a plurality of connection pads; a first semiconductor chip mounted in the abovementioned recessed portion; a second semiconductor chip which has a plurality of electrode pads on an obverse surface of at least one end portion thereof, and which is stacked on the abovementioned first semiconductor chip in such a way that at least one end portion thereof projects out from the abovementioned first semiconductor chip; and a plurality of wires which electrically connect the plurality of connection pads on the abovementioned wiring substrate respectively to the abovementioned plurality of electrode pads on the abovementioned second semiconductor chip; wherein the abovementioned one end portion of the abovementioned second semiconductor chip extends beyond an inside surface of the abovementioned recessed portion and is supported on one surface of the abovementioned wiring substrate.

A second mode of embodiment of the present invention relates to a method of manufacturing a semiconductor device, comprising: (a) mounting a first semiconductor chip in a recessed portion of a wiring substrate having, on one surface, the abovementioned recessed portion and a plurality of connection pads; (b) stacking a second semiconductor chip, which has a plurality of electrode pads on an obverse surface of at least one end portion thereof, on the abovementioned first semiconductor chip in such a way that at least one end portion thereof projects out from the abovementioned first semiconductor chip; and (c) electrically connecting the plurality of connection pads on the abovementioned wiring substrate respectively, using wires, to the abovementioned plurality of electrode pads on the abovementioned second semiconductor chip; wherein abovementioned (b) comprises extending the abovementioned one end portion of the abovementioned second semiconductor chip beyond an inside surface of the abovementioned recessed portion and supporting it on one surface of the abovementioned wiring substrate.

Advantages of the Invention

According to the present invention it is possible to provide a semiconductor device in which an overhanging portion can be securely supported.

MODES OF EMBODYING THE INVENTION

Preferred embodiments of the present invention will now be described in detail with reference to the drawings.

First the general structure of the semiconductor device 200 according to the first embodiment of the present invention will be described with reference to FIG. 1 to FIG. 3.

Here, a semiconductor memory in which a memory chip is installed is illustrated by way of example as the semiconductor device 200.

Figure 1:
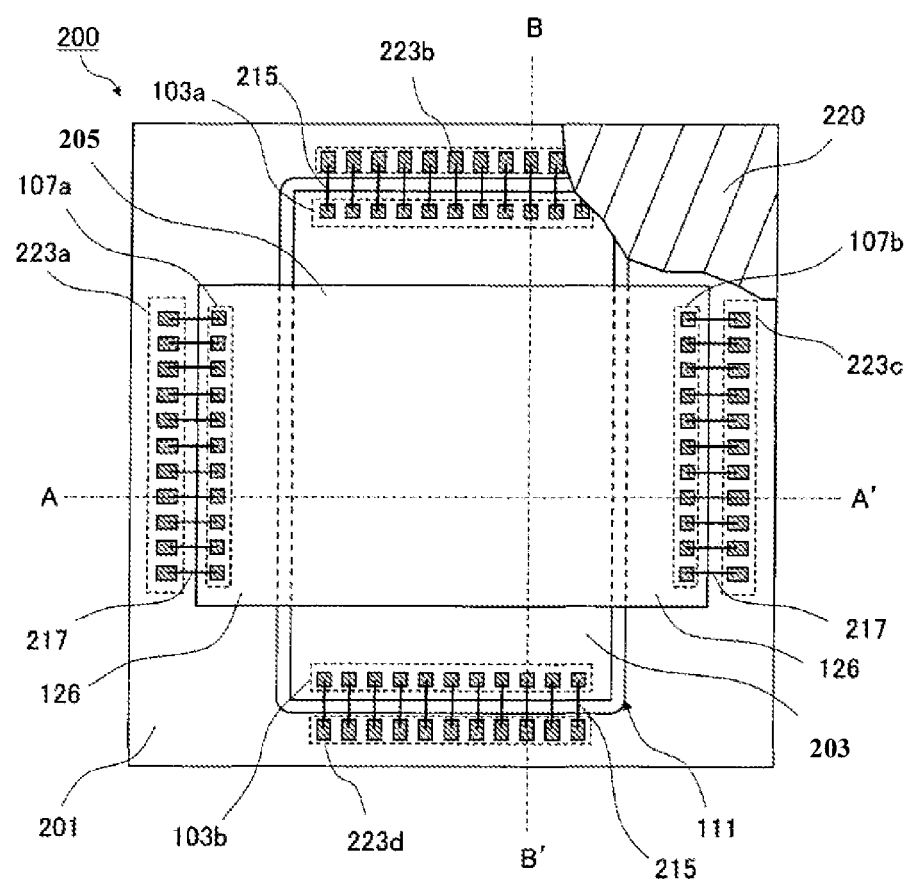
FIG. 1 is plan view illustrating a semiconductor device 200 according to a first embodiment, in which only a portion of a sealing body 220 is depicted.
Figure 2:
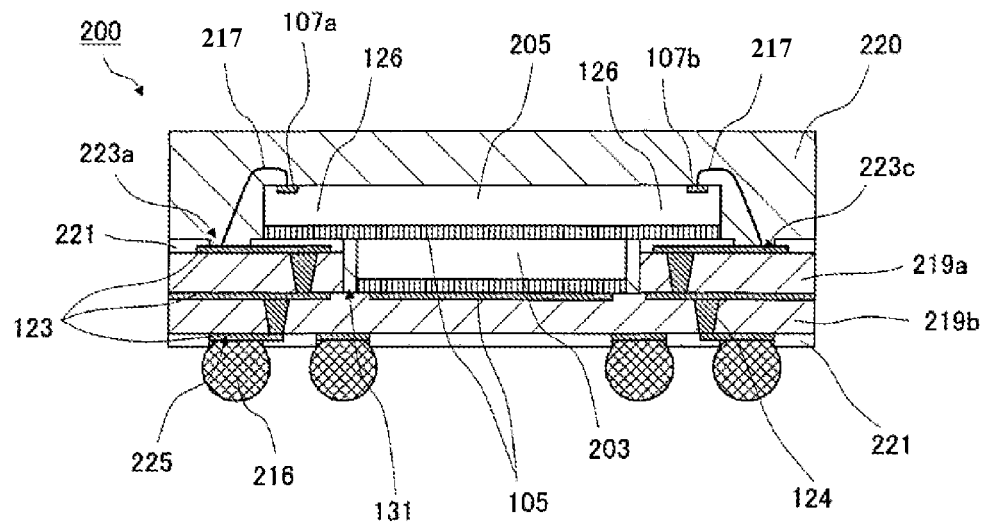
FIG. 2 is a cross-sectional view through A-A' in FIG. 1.
Figure 3:
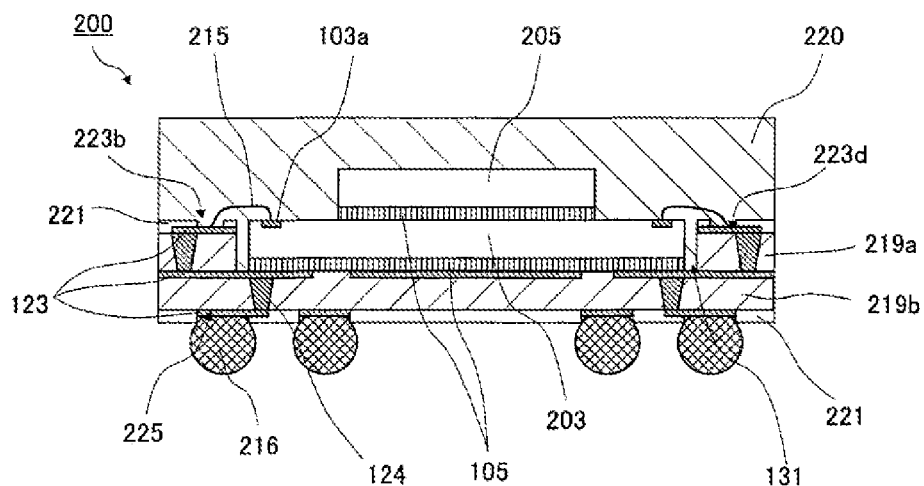
FIG. 3 is a cross-sectional view through B-B' in FIG. 1.

As illustrated in FIG. 1 to FIG. 3, the semiconductor device 200 has a wiring substrate 201 having, on one surface, a recessed portion 111 and a plurality of connection pads 223a, 223b, 223c, 223d; a first semiconductor chip 203 mounted in the recessed portion 111; a second semiconductor chip 205 which has a plurality of electrode pads 107a, 107b on an obverse surface of at least one end portion (here, both ends) thereof, and which is stacked on the first semiconductor chip 203 in such a way that at least one end portion (here, both ends) thereof projects out from the first semiconductor chip 203; and a plurality of wires 217 (bonding wires) which electrically connect the plurality of connection pads 223a, 223c on the wiring substrate 201 respectively to the plurality of electrode pads 107a, 107b on the second semiconductor chip 205, and said one end portion (here, both ends) of the second semiconductor chip 205 extends beyond an inside surface of the recessed portion 111 and is supported on one surface of the wiring substrate 201.

The semiconductor device 200 also has wires 215 connecting the connection pads 223b, 223d on the wiring substrate 201 to electrode pads 103a, 103b (discussed hereinafter) on the first semiconductor chip 203, and also has solder balls 216 serving as external terminals for connecting the semiconductor device 200 to an external device, and a sealing body 220 which is disposed on one surface of the wiring substrate 201 and is provided in such a way as to cover said one surface side of the wiring substrate 201.

Details of the members constituting the semiconductor device 200 according to the first embodiment of the present invention will next be described with reference to FIG. 1 to FIG. 3.

The wiring substrate 201 has, for example, an insulating substrate 219a (upper substrate layer) and an insulating substrate 219b (lower substrate layer) comprising substantially quadrilateral plate-shaped glass epoxy, prepregs or the like, and wiring layers 123 (three layers) formed in prescribed patterns on the upper surface of the insulating substrate 219a, which is the upper insulating substrate, the lower surface of the insulating substrate 219b, which is the lower insulating substrate, and between the abovementioned insulating substrate 219a and insulating substrate 219b, the three wiring layers 123 being electrically connected by means of vias 124. Insulating films 221 such as solder resist films are formed on the upper surface of the insulating substrate 219a and the lower surface of the insulating substrate 219b, portions of the wiring layers 123 being exposed through the insulating films 221. Sites in which the wiring layer 123 on the upper surface of the insulating substrate 219a is exposed through openings in the insulating film 221 form the connection pads 223a, 223b, 223c, 223d, and sites in which the wiring layer 123 on the lower surface of the insulating substrate 219b is exposed through openings in the insulating film 221 form lands 225. As illustrated in FIG. 1, the plurality of connection pads 223a, 223b, 223c, 223d are respectively arranged in the vicinity of the peripheral edge portions of the four sides which form the quadrilateral shape of the upper surface of the insulating substrate 219a, and they are electrically connected to the corresponding lands 225 via the wiring layers 123 and the vias 124. Further, the plurality of lands 225 are disposed in a lattice formation on the lower surface of the insulating substrate 219b.

Further, a rectangular open portion 131 corresponding to the planar shape of the first semiconductor chip 203 is formed in a central region of the insulating substrate 219a, the open portion 131 and the insulating substrate 219b forming the recessed portion 111.

The first semiconductor chip 203 has a substantially quadrilateral (rectangular) plate shape, prescribed circuits and electrode pads 103a, 103b being formed on one surface side thereof. The plurality of electrode pads 103a, 103b are arranged respectively along the short sides of the rectangle of the first semiconductor chip 203. The first semiconductor chip 203 is mounted in the recessed portion 111 of the wiring substrate 201, with the interposition of an adhesive member 105 such as a DAF (Die Attached Film) or an insulating paste, the reverse surface side (the surface side opposite to the surface on which the electrode pads 103a, 103b are provided) of the first semiconductor chip 203 facing the wiring substrate 201.

The recessed portion 111 is configured such that its size is approximately 100 μm larger than the chip size of the first semiconductor chip 203, taking into account the mounting accuracy of the first semiconductor chip 203 and the filling properties of the sealing body 220, and gaps of approximately 50 μm relative to each side are formed between the recessed portion 111 and the first semiconductor chip 203.

It should be noted that the recessed portion 111 may be made larger, to the extent that at least the parts below the electrode pads 107a, 107b (discussed in detail hereinafter) formed on overhanging portions 126 of the second semiconductor chip 205 can be supported by the wiring substrate 201.

Further, the plurality of electrode pads 103a, 103b on the first semiconductor chip 203 and the corresponding connection pads 223b, 223d on the wiring substrate 201 are electrically connected by means of the wires 215, comprising Au, Cu or the like.

In the same way as with the first semiconductor chip 203, the second semiconductor chip 205 has a substantially quadrilateral (rectangular) plate shape, and prescribed circuits and electrode pads 107a, 107b are formed on one surface side thereof. The plurality of electrode pads 107a, 107b are formed along the short sides of the rectangle of the second semiconductor chip 205.

The second semiconductor chip 205 is stacked on the first semiconductor chip 203 in such a way that its reverse surface side (the surface side opposite to the surface on which the electrode pads 107a, 107b are provided) faces the first semiconductor chip 203.

More specifically, the second semiconductor chip 205 is stacked, with the interposition of the adhesive member 105 such as a DAF or an insulating paste, in a condition in which it is rotated through 90° relative to the first semiconductor chip 203, and is disposed in such a way that the two short sides of the second semiconductor chip 205 overhang from the first semiconductor chip 203.

The overhanging portions 126 on the two short sides of the second semiconductor chip 205 are adhered to and supported on one surface of the wiring substrate 201 with the interposition of the adhesive member 105. To elaborate, the overhanging portions 126 of the second semiconductor chip 205 extend beyond the inside surface of the recessed portion 111 and are supported on one surface of the wiring substrate 201.

Adopting a structure whereby the overhanging portions 126 of the second semiconductor chip 205 are supported on one surface of the wiring substrate 201 in this way makes it possible to reduce the chip thickness of the second semiconductor chip 205 (for example to a thickness of 100 μm or less).

Further, the plurality of electrode pads 107a, 107b on the second semiconductor chip 205 and the corresponding connection pads 223a, 223c on the wiring substrate 201 are electrically connected by means of the wires 217, comprising Au, Cu or the like.

Further, the sealing body 220 is formed on one surface of the wiring substrate 201, and the first semiconductor chip 203, the second semiconductor chip 205 and the wires 215, 217 mounted on the wiring substrate 201 are covered by the sealing body 220.

Further, because the gaps between the recessed portion 111 of the wiring substrate 201 and the first semiconductor chip 203 are formed to a size that takes into account the filling properties of the sealing body 220, these gaps are also filled by the sealing body 220.

Further, as discussed hereinabove, adopting a structure for the semiconductor device 200 whereby the overhanging portions 126 of the second semiconductor chip 205 are supported on one surface of the wiring substrate 201 makes it possible to reduce the chip thickness of the second semiconductor chip 205, and therefore reducing the chip thickness of the second semiconductor chip 205 makes it possible also to reduce the thickness of the sealing body 220.

Further, the solder balls 216 are mounted respectively on the plurality of lands 225 on the other surface of the wiring substrate 201.

A detailed description has been given hereinabove regarding the members constituting the semiconductor device 200.

A method of manufacturing the semiconductor device 200 will be described next with reference to FIG. 4 to FIG. 7.

Figure 4:
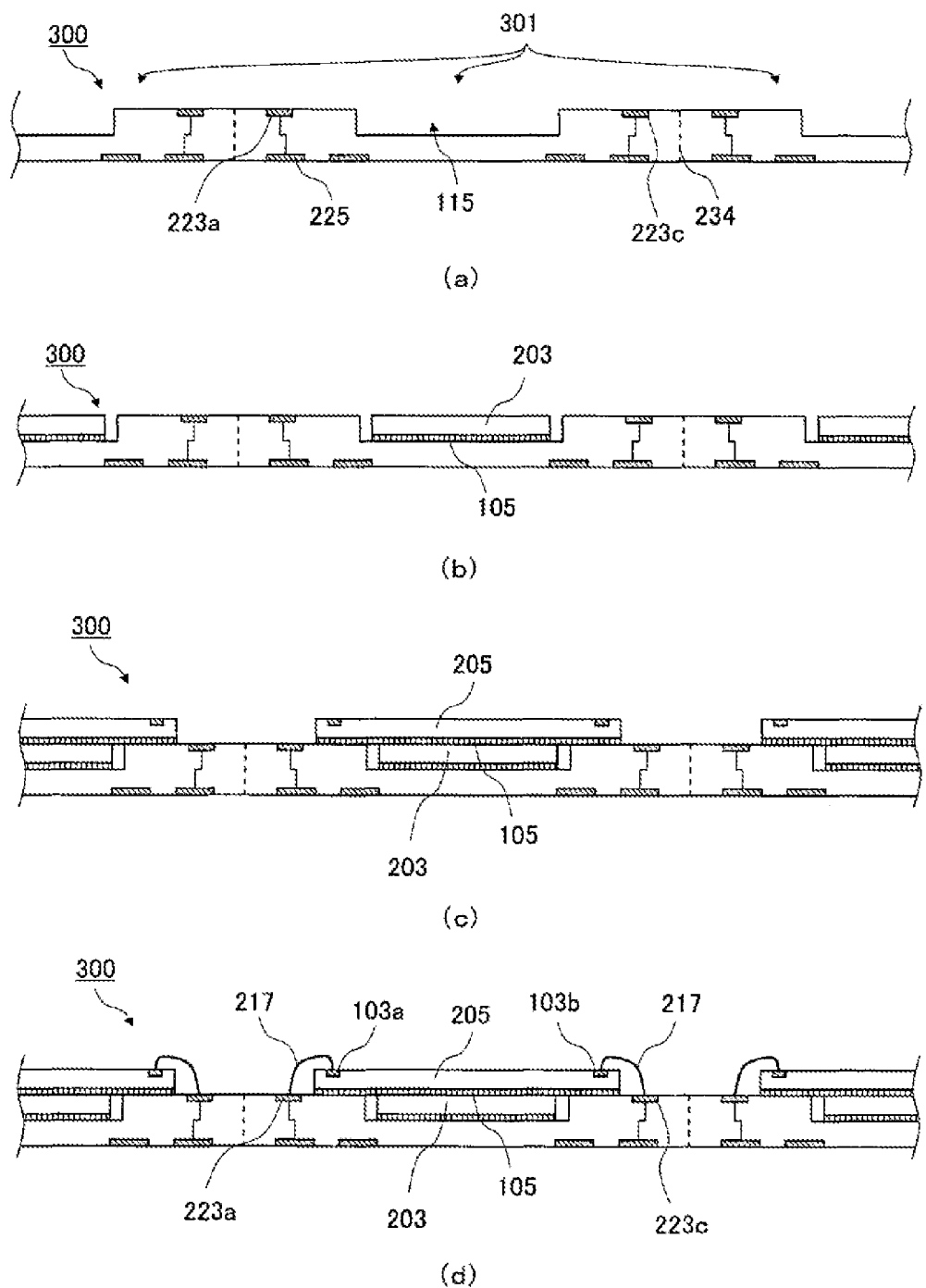
FIG. 4 is a drawing illustrating a procedure for manufacturing the semiconductor device 200.

First, a wiring mother substrate 300 as illustrated in FIG. 4 (a) is prepared.

The wiring mother substrate 300 has a plurality of product-forming portions 301 disposed in a matrix formation, each product-forming portion 301 corresponding to the wiring substrate 201.

Next, as illustrated in FIG. 4 (b), the first semiconductor chip 203 is mounted on the product-forming portion 301 of the wiring mother substrate 300 using a chip mounter or the like, which is not shown in the drawings.

The first semiconductor chip 203 is mounted in the recessed portion 111 in such a way that the short sides on which the electrode pads 103a, 103b are provided face the connection pads 223b, 223d. The first semiconductor chip 203 is adhesively secured to the wiring mother substrate 300 by means of the adhesive member 105 comprising a DAF or the like, provided on the other surface.

Next, the electrode pads 103a, 103b on the first semiconductor chip 203 are connected to the corresponding connection pads 223b, 223d by means of the wires 215 (see FIG. 3). A wire bonding device, discussed hereinafter, can be employed to form the connections using the wires 215. The connections are formed, for example, by means of ball bonding using an ultrasonic thermo-compression bonding method. More specifically, the distal ends of the wire 215, which has been melted to form a ball, is bonded onto the electrode pad 103a, 103b using ultrasonic thermo-compression bonding, and the rear end of the wire 215 is bonded onto the corresponding connection pad 223b, 223d using ultrasonic thermo-compression bonding in such a way that the wire 215 describes a prescribed loop shape.

Here, by mounting the first semiconductor chip 203 in the recessed portion 111 of the wiring substrate 201, the wires 215 connecting the electrode pads 103a, 103b on the first semiconductor chip 203 to the connection pads 223b, 223d on the wiring substrate 201 can be connected using a shorter length of wire than if the first semiconductor chip 203 is stacked without the provision of the recessed portion 111 (see FIG. 3). Cost savings can be made by reducing the length of the wire. Further, by reducing the length of the wire it is possible to suppress the occurrence of wire short-circuiting and wire sweep during resin injection, discussed hereinafter.

Next, as illustrated in FIG. 4 (c), the second semiconductor chip 205 is mounted on the first semiconductor chip 203 using a chip mounter or the like, which is not shown in the drawings.

The second semiconductor chip 205 is stacked on one surface of the wiring substrate 201 in such a way that the electrode pads 103a, 103b (see FIG. 2) on the first semiconductor chip 203 are exposed, and in such a way that the overhanging portions 126 face the connection pads 223a, 223c.

The second semiconductor chip 205 is secured to the first semiconductor chip 203 by means of the adhesive member 105 comprising a DAF or the like, provided on the other surface, and the overhanging portions 126 are secured to one surface of the wiring substrate 201.

Figure 5:
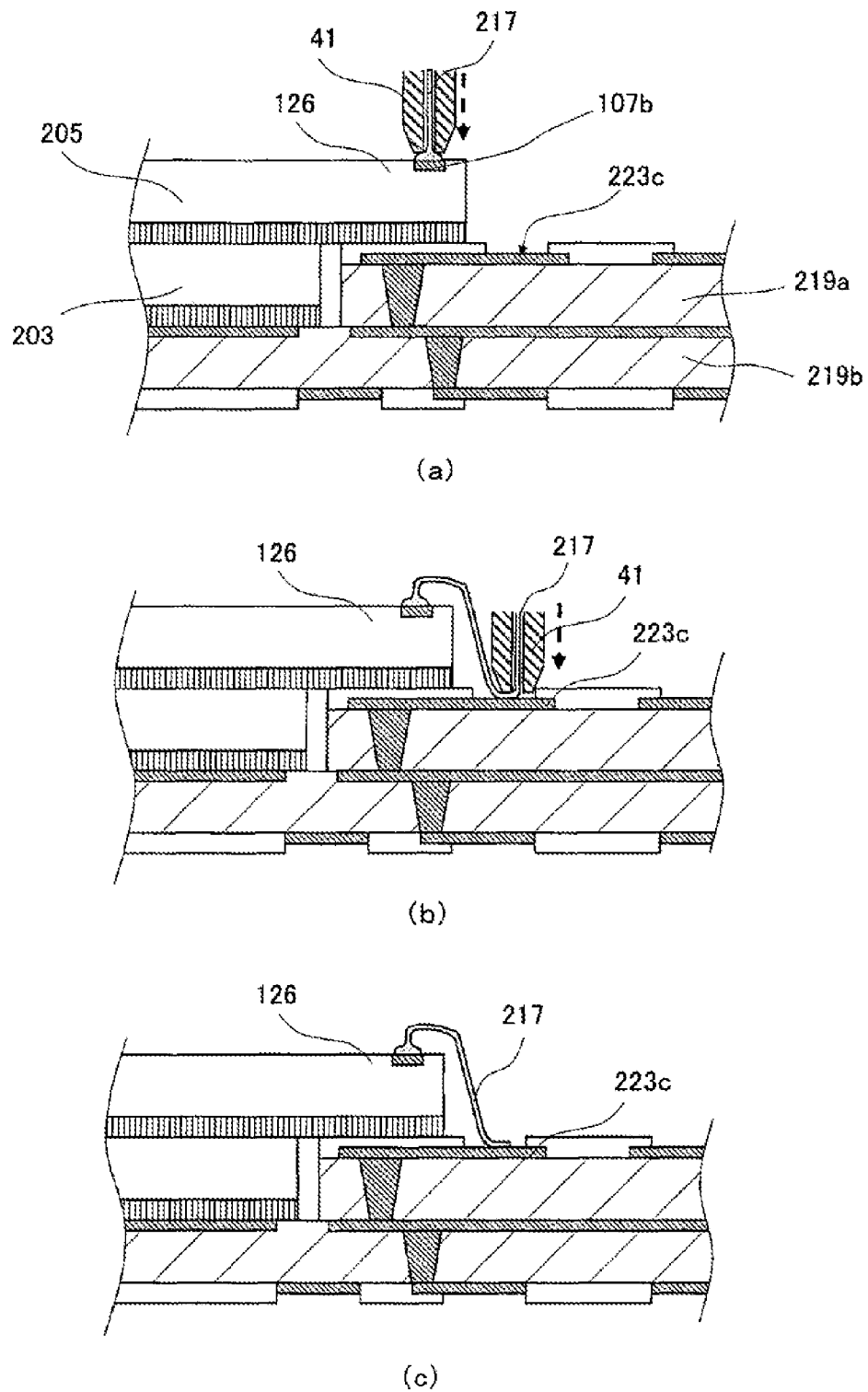
FIG. 5 is a drawing illustrating the procedure for manufacturing the semiconductor device 200, which shows the details of wire bonding.

Next, as illustrated in FIG. 4 (d) and FIG. 5, the electrode pads 107a, 107b on the second semiconductor chip 205 are respectively connected to the corresponding connection pads 223a, 223c by means of the wires 217.

More specifically, first the wiring mother substrate 300, on which the second semiconductor chip 205 has been mounted by stacking, is held on a stage of a wire bonding device, which is not shown in the drawings.

Next, the distal end of the wire 217 which has been guided out from the distal end of a capillary 41 is melted to form a ball at the distal end of the wire 217. Then, as illustrated in FIG. 5 (a), the distal end of the wire on which the above-mentioned ball has been formed is pressure-bonded by the capillary 41 to the electrode pad 107*a*, 107*b* on the second semiconductor chip 205 by means of ultrasonic thermo-compression bonding.

Here, the configuration is such that the overhanging portions 126 (overhanging from the first semiconductor chip 203) of the second semiconductor chip 205 are adhesively secured to one surface of the wiring substrate 201, and thus the load and the ultrasonic waves from the capillary 41 can be satisfactorily transmitted to the electrode pads 107*a*, 107*b*.

Then the capillary 41 is moved in such a way that the wire 217 forms a prescribed loop, and as illustrated in FIG. 5 (*b*) the other end of the wire 217 is pressure-bonded to the corresponding connection pad 223*a*, 223*c* on the wiring substrate 201 by means of ultrasonic thermo-compression bonding.

Then, by pulling the rear end of the wire 217 so as to cut it, using the capillary 41, the wires 217 which electrically connect the electrode pads 107*a*, 107*b* on the second semiconductor chip 205 to the connection pads 223*a*, 223*c* on the wiring substrate 201 are formed, as illustrated in FIG. 5 (*c*).

It should be noted that, as discussed hereinabove, the configuration is such that the overhanging portions 126 (overhanging from the first semiconductor chip 203) of the second semiconductor chip 205 are adhesively secured to one surface of the wiring substrate 201, and thus even if the chip thickness of the second semiconductor chip 205 is reduced to 100 μm or less, for example, wire bonding can be effected without generating chip cracks. Further, as discussed hereinabove, the load and the ultrasonic waves from the capillary 41 can be satisfactorily transmitted to the electrode pads 107*a*, 107*b* and the wires can be satisfactorily connected, and therefore the reliability of the semiconductor device 200 can be improved.

Further, because the second semiconductor chip 205 can be made thinner, the semiconductor device 200 can also be made thinner.

Next, the sealing body 220 is formed on one surface side of the wiring mother substrate 300 by molding in one batch.

More specifically, first the wiring mother substrate 300 is conveyed into a molding device 400.

Figure 6:
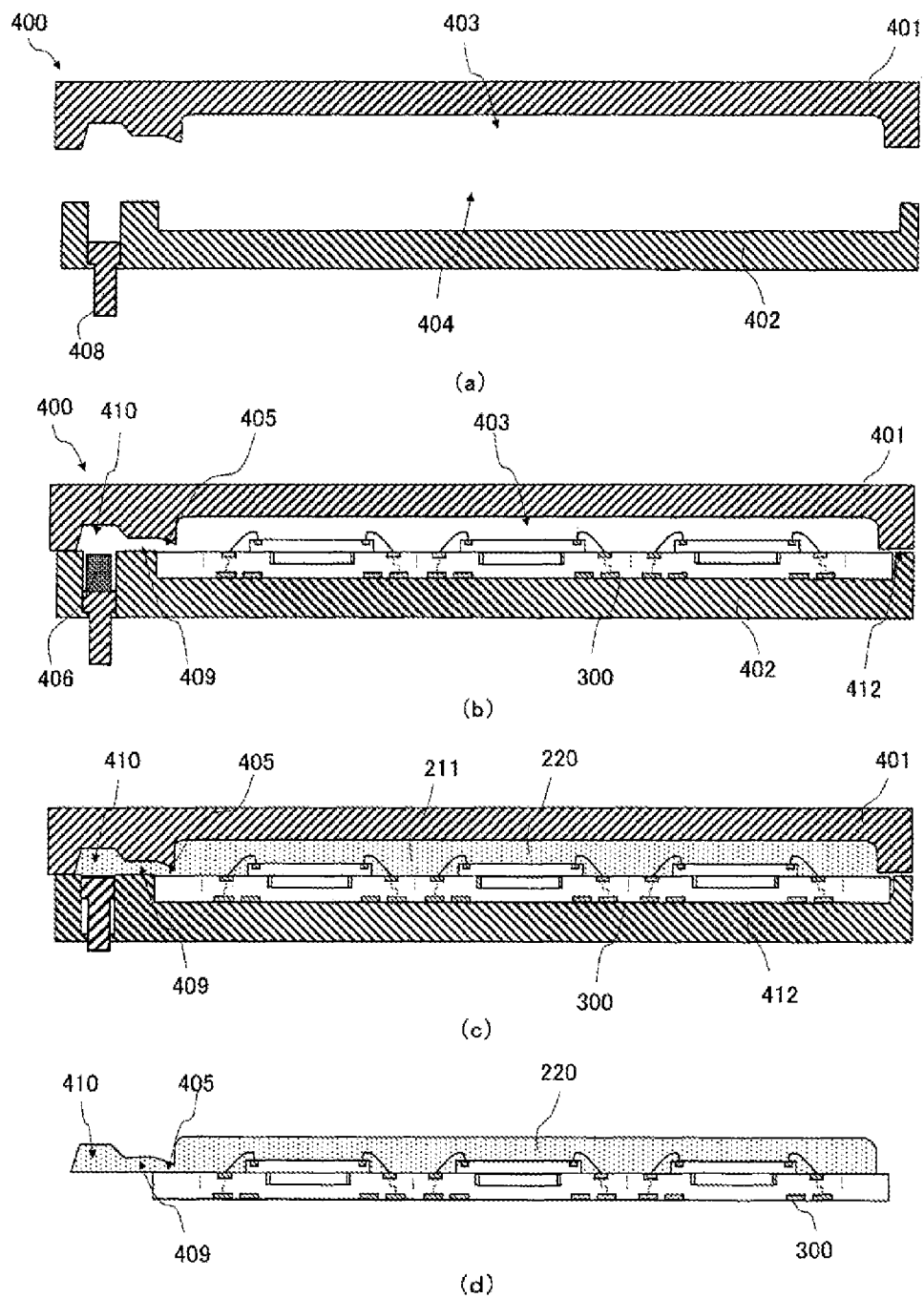
FIG. 6 is a drawing illustrating the procedure for manufacturing the semiconductor device 200, which shows the details of resin sealing.

As illustrated in FIG. 6 (*a*), the molding device 400 has a molding die comprising an upper die 401 and a lower die 402. A cavity 403 is formed in the upper die 401, and a recessed portion 404 in which the wiring mother substrate 300 is mounted is formed in the lower die 402.

The wiring mother substrate 300 is set in the recessed portion 404 in the lower die 402 of the molding device 400.

Then, by clamping the wiring mother substrate 300 using the upper die 401 and the lower die 402, a gate portion 405 and the cavity 403 having a prescribed size are formed above the wiring mother substrate 300, as illustrated in FIG. 6 (*b*). The present embodiment is configured using a MAP (Mold Array Package) system, and thus the cavity 403 is configured with a size such that it covers a plurality of product-forming portions 301 in one batch.

Next, a resin tablet 406 (see FIG. 6 (*b*)) is supplied to a pot in the lower die 402 and is melted by the application of heat.

Next, as illustrated in FIG. 6 (*c*), molten sealing resin 211 is injected into the cavity 403 through the gate portion 405 by means of a plunger 408, and the cavity 403 is filled with the sealing resin 211.

It should be noted that, as discussed hereinabove, the configuration is such that the overhanging portions 126 of the second semiconductor chip 205 are adhesively retained on one surface of the wiring substrate 201, and it is therefore possible to restrict deflection of the overhanging portions 126 of the second semiconductor chip 205 that arises due to the injection pressure when the sealing resin 211 is injected, and the load acting on the second semiconductor chip 205 can thus be reduced.

When the cavity 403 has been filled with the sealing resin 211, the sealing resin 211 is cured at a prescribed temperature, for example 180° C., thereby hardening the sealing resin 211.

Figure 7:
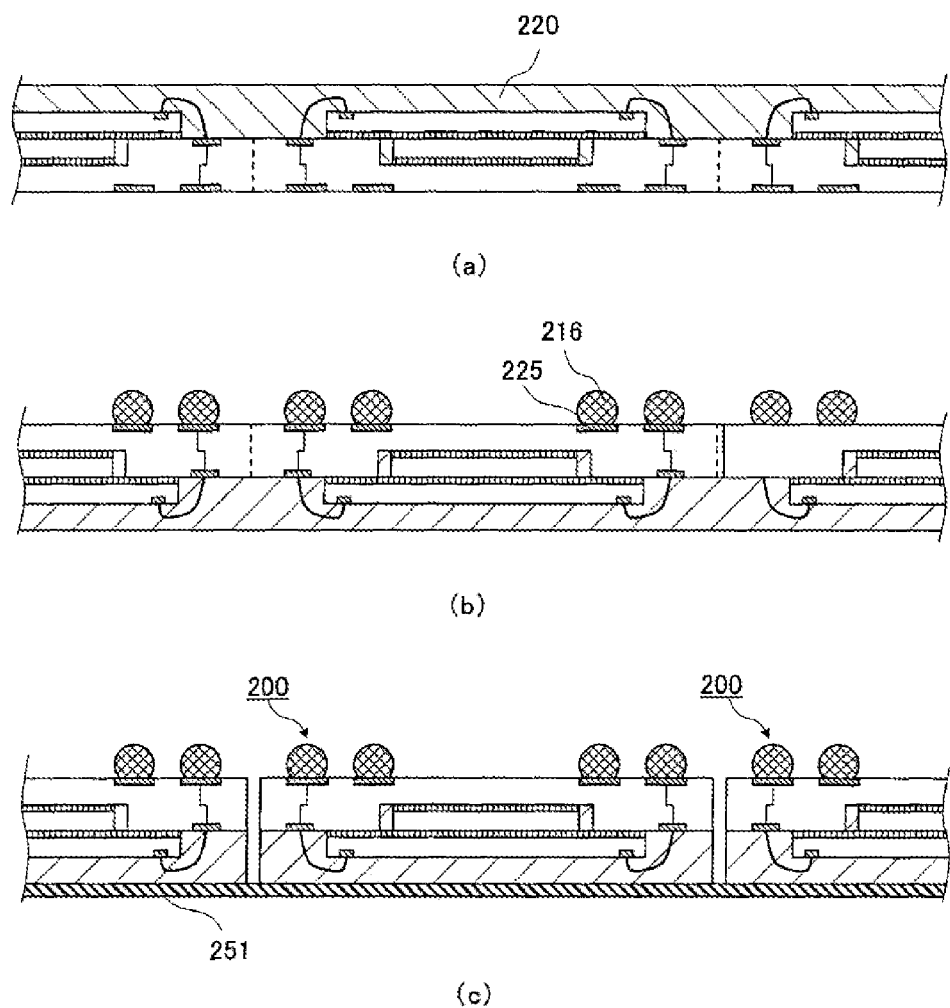
FIG. 7 is a drawing illustrating the procedure for manufacturing the semiconductor device 200.

The upper die 401 and the lower die 402 are then separated, the wiring mother substrate 300 is removed, and reflow is performed at a prescribed temperature, for example 240° C., to harden the sealing resin 211 completely, thereby forming the sealing body 220 which covers, in one batch, a sealed region of the wiring mother substrate 300, as illustrated in FIG. 6 (*d*) and FIG. 7 (*a*). Then the gate portion 405, a runner portion 409 and a cull portion 410, connected to the sealing body 220 as illustrated in FIG. 6 (*d*), are removed.

Next, as illustrated in FIG. 7 (*b*), the solder balls 216 are mounted on each of the lands 225 on the other surface side of the wiring mother substrate 300.

More specifically, using a suction-attachment mechanism, which is not shown in the drawings, in which a plurality of suction-attachment holes are formed matching the arrangement of the lands 225 on the wiring substrate 201, for example, the solder balls 216 are held in the suction-attachment holes, and the held solder balls 216 are mounted in one batch on the lands 225 of the wiring substrate 201, with the interposition of flux.

After the solder balls 216 have been mounted on all of the product-forming portions 301, the solder balls 216 are secured to the wiring substrate 201 by effecting reflow.

Next, as illustrated in FIG. 7 (*c*), the sealing body 220 is caused to adhere to a dicing tape 251, and the sealing body 220 and the wiring mother substrate 300 are supported by the dicing tape 251. Then using a dicing blade, which is not shown in the drawings, the wiring mother substrate 300 and the sealing body 220 are cut lengthwise and crosswise along dicing lines 234 (see FIG. 4 (*a*)). By this means the wiring mother substrate 300 is diced into individual product-forming portions 301. The diced product-forming portions 301 and sealing bodies 220 are then picked up from the dicing tape 251 to yield semiconductor devices 200 as illustrated in FIG. 1.

Thus, according to the first embodiment, the semiconductor device 200 has the wiring substrate 201 having, on one surface, the recessed portion 111 and the plurality of connection pads 223*a*, 223*b*, 223*c*, 223*d*; the first semiconductor chip 203 mounted in the recessed portion 111; the second semiconductor chip 205 which has the plurality of electrode pads 107*a*, 107*b* on the obverse surface of at least one end portion thereof, and which is stacked on the first semiconductor chip 203 in such a way that at least one end portion thereof projects out from the first semiconductor chip 203; and the plurality of wires 217 which electrically connect the plurality of connection pads 223*a*, 223*c* on the wiring substrate 201 respectively to the plurality of electrode pads 107*a*, 107*b* on the second semiconductor chip 205, and said one end portion (here, both ends) of the second semiconductor chip 205 extends beyond the inside surface of the recessed portion 111 and is supported on one surface of the wiring substrate 201.

Thus the overhanging portion 126 can be securely supported by the wiring substrate 201, and wire bonding can be effected without generating chip cracks. Further, as discussed hereinabove, the load and the ultrasonic waves from the capillary 41 can be satisfactorily transmitted to the electrode pads 107a, 107b and the wires can be satisfactorily connected, and therefore the reliability of the semiconductor device 200 can be improved.

Further, because the second semiconductor chip 205 can be made thinner, the semiconductor device 200 can also be made thinner.

A second embodiment will now be described with reference to FIG. 8 to FIG. 10.

In the second embodiment, the second semiconductor chip 205 in the first embodiment is mounted by stacking on the first semiconductor chip 203 using an adhesive member 105a such as an FOW (Film On Wire), and the adhesive member 105a fills the gaps between the recessed portion 111 of the wiring substrate 201 and the first semiconductor chip 203.

It should be noted that in the second embodiment, the same numbers are appended to elements that fulfill the same function as in the first embodiment, and the description will mainly relate to parts that differ from the first embodiment.

Figure 8:
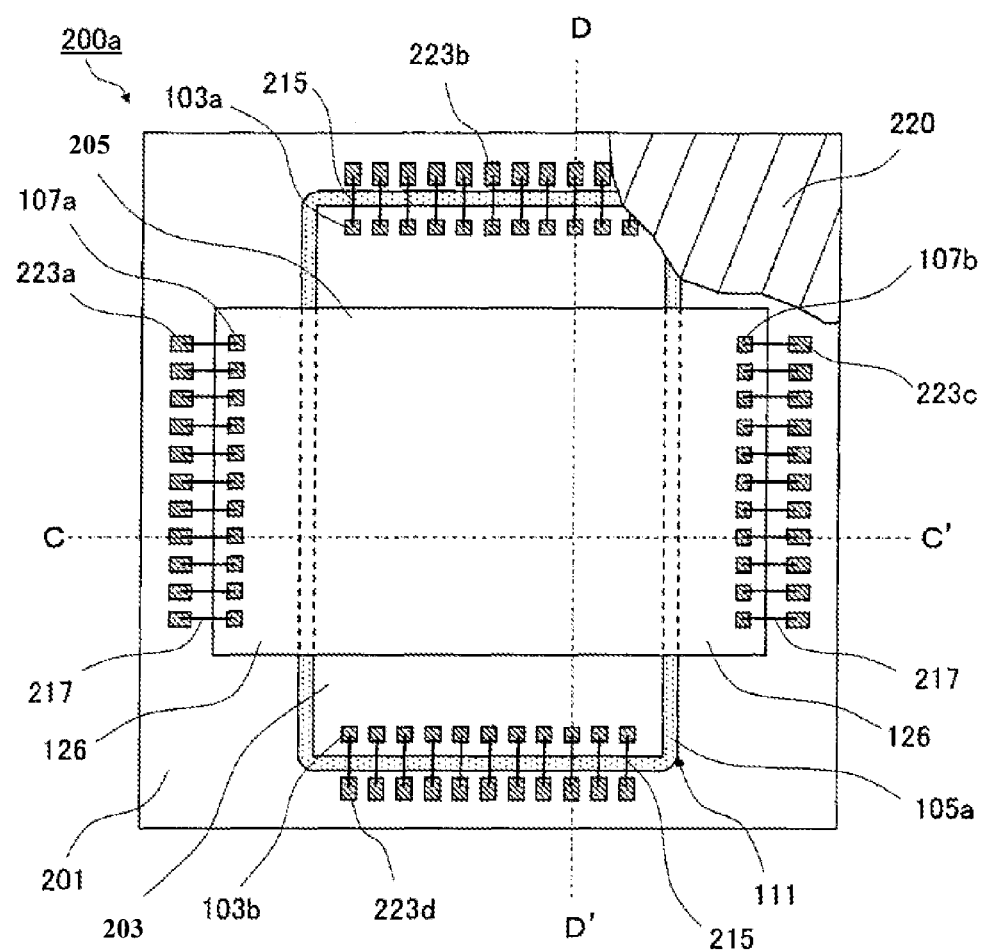
FIG. 8 is plan view illustrating a semiconductor device 200a according to a second embodiment, in which only a portion of the sealing body 220 is depicted.
Figure 9:
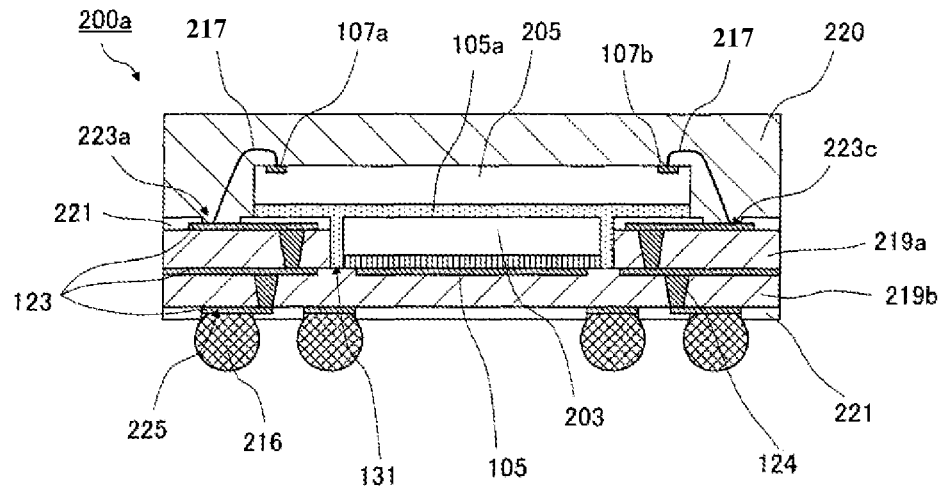
FIG. 9 is a cross-sectional view through C-C' in FIG. 8
Figure 10:
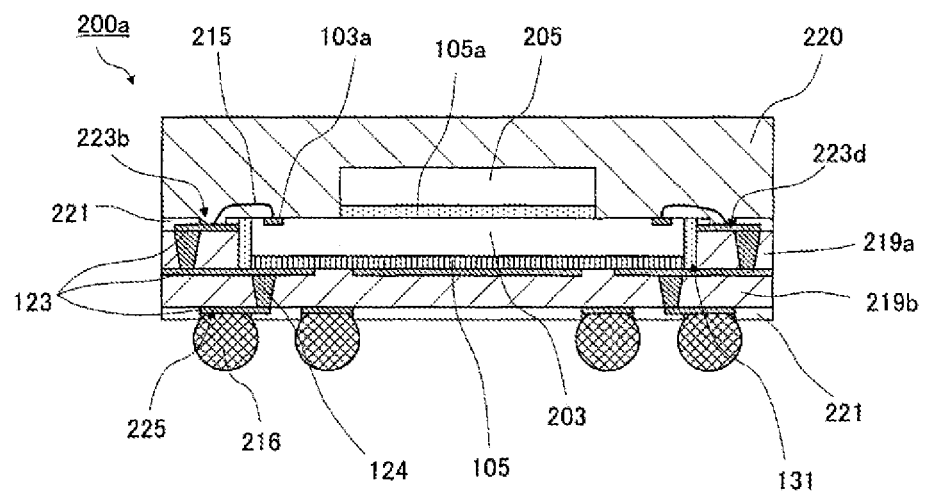
FIG. 10 is a cross-sectional view through D-D' in FIG. 8.

As illustrated in FIG. 8 to FIG. 10, in a semiconductor device 200a according to the second embodiment, the second semiconductor chip 205 is mounted by stacking on the first semiconductor chip 203 using the adhesive member 105a, and the adhesive member 105a fills the gaps between the recessed portion 111 of the wiring substrate 201 and the first semiconductor chip 203.

In this way, a structure may be adopted in which the gaps between the recessed portion 111 of the wiring substrate 201 and the first semiconductor chip 203 are filled in advance, prior to the resin sealing, using a material that is different from the material of the sealing body 220.

Adopting such a structure makes it possible to suppress the generation of voids in the gaps between the recessed portion 111 and the first semiconductor chip 203 when the sealing body 220 is formed.

It should be noted that the method of manufacturing the semiconductor device 200a is the same as in the first embodiment, except that the gaps between the recessed portion 111 and the first semiconductor chip 203 are filled in advance, prior to the resin sealing, using the adhesive member 105a, and thus a description of the method of manufacture is omitted.

Thus, according to the second embodiment, the semiconductor device 200a has the wiring substrate 201 having, on one surface, the recessed portion 111 and the plurality of connection pads 223a, 223b, 223c, 223d; the first semiconductor chip 203 mounted in the recessed portion 111; the second semiconductor chip 205 which has the plurality of electrode pads 107a, 107b on the obverse surface of at least one end portion thereof, and which is stacked on the first semiconductor chip 203 in such a way that at least one end portion thereof projects out from the first semiconductor chip 203; and the plurality of wires 217 which electrically connect the plurality of connection pads 223a, 223c on the wiring substrate 201 respectively to the plurality of electrode pads 107a, 107b on the second semiconductor chip 205, and said one end portion (here, both ends) of the second semiconductor chip 205 extends beyond the inside surface of the recessed portion 111 and is supported on one surface of the wiring substrate 201.

This embodiment therefore exhibits the same advantages as the first embodiment.

Further, according to the second embodiment, in the semiconductor device 200a the second semiconductor chip 205 is stacked on the first semiconductor chip 203 using the adhesive member 105a, and the adhesive member 105a fills the gaps between the recessed portion 111 of the wiring substrate 201 and the first semiconductor chip 203.

It is therefore possible to suppress the generation of voids in the gaps between the recessed portion 111 and the first semiconductor chip 203 when the sealing body 220 is formed.

A third embodiment will now be described with reference to FIG. 11 to FIG. 13.

In the third embodiment, a recessed portion 111b is configured such that it extends as far as the edges on two opposing sides of the wiring substrate 201 in the first embodiment (in other words, the recessed portion 111b consists of a groove portion).

It should be noted that in the third embodiment, the same numbers are appended to elements that fulfill the same function as in the first embodiment, and the description will mainly relate to parts that differ from the first embodiment.

Figure 11:
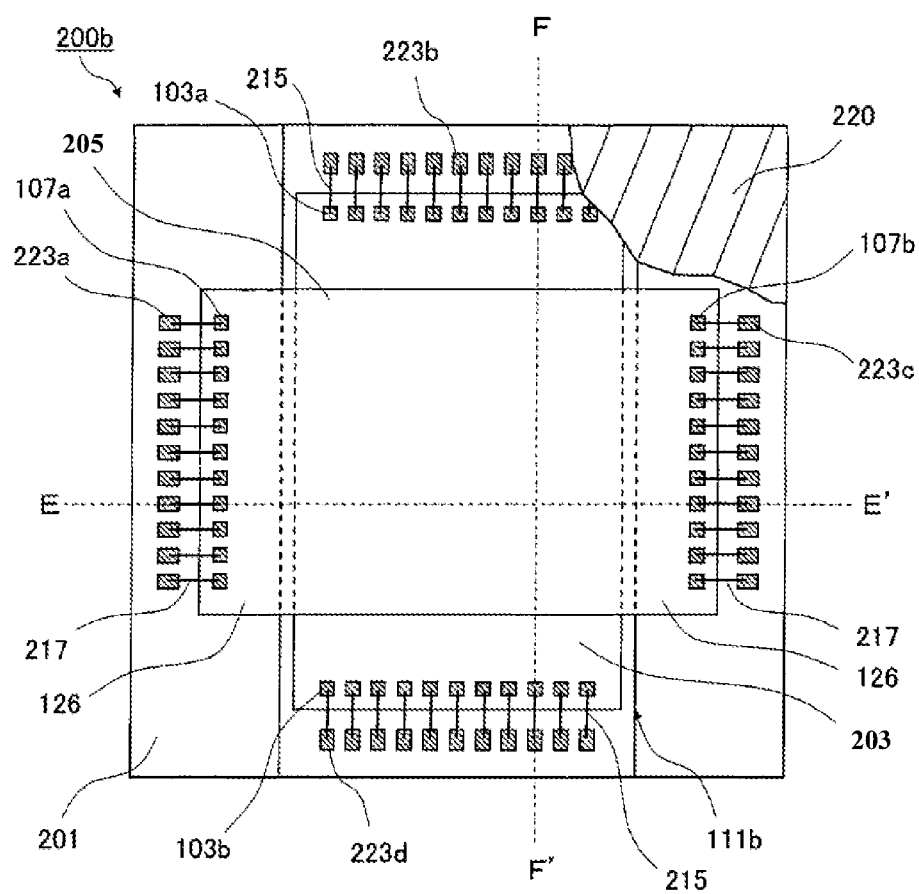
FIG. 11 is plan view illustrating a semiconductor device 200b according to a third embodiment, in which only a portion of the sealing body 220 is depicted.
Figure 12:
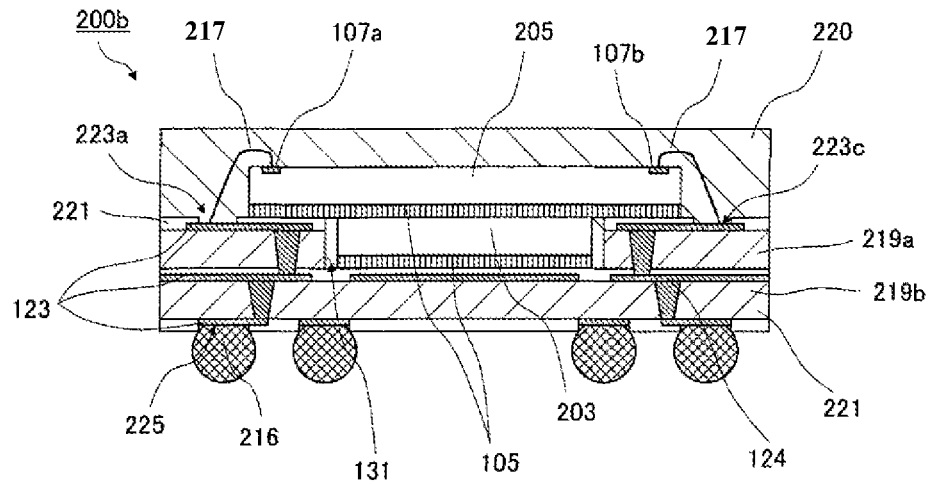
FIG. 12 is a cross-sectional view through E-E' in FIG. 11.
Figure 13:
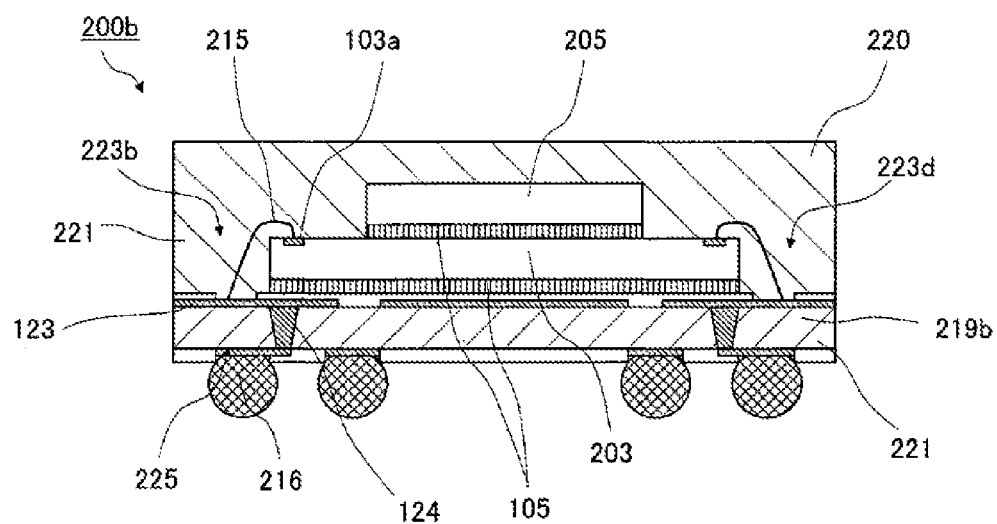
FIG. 13 is a cross-sectional view through F-F' in FIG. 11.

As illustrated in FIG. 11 to FIG. 13, in a semiconductor device 200b according to the third embodiment the recessed portion 111b formed in the wiring substrate 201 is configured such that it extends as far as the edges on two opposing sides of the wiring substrate 201, one end portion of the second semiconductor chip 205 projecting out from the first semiconductor chip 203 toward a side other than said two sides (the sides on which the recessed portion 111b extends as far as the edge) of the wiring substrate 201.

In other words, the recessed portion 111b is configured as a groove portion linking the two opposing sides of the wiring substrate 201.

In this structure the configuration is such that the side on which the recessed portion 111b extends to the edge, for example the F side, constitutes the gate side when the sealing resin 211 is injected (see FIG. 6), and the sealing resin 211 is filled toward the F side, which constitutes the air vent side. Further, the wiring mother substrate 300 is configured such that adjacent product-forming portions 301 (see FIG. 4) and recessed portions 111b are connected to each other.

Thus the shape of the recessed portion does not necessarily need to be a shape in which a planar shape is enclosed in the form of an annulus, as in the first embodiment, and it may be a shape such as a groove portion.

By adopting such a shape, the filling properties of the sealing resin 211 into the recessed portion 111b of the wiring substrate 201 can be improved, and the generation of voids during resin sealing can be reduced.

It should be noted that the method of manufacturing the semiconductor device 200b is the same as in the second embodiment, and thus a description thereof is omitted.

Thus, according to the third embodiment, the semiconductor device 200b has the wiring substrate 201 having, on one surface, the recessed portion 111b and the plurality of connection pads 223a, 223b, 223c, 223d; the first semiconductor chip 203 mounted in the recessed portion 111b; the second semiconductor chip 205 which has the plurality of electrode pads 107a, 107b on the obverse surface of at least one end portion thereof, and which is stacked on the first semiconductor chip 203 in such a way that at least one end portion thereof projects out from the first semiconductor chip 203; and the plurality of wires 217 which electrically connect the plurality of connection pads 223a, 223c on the wiring substrate 201 respectively to the plurality of electrode pads 107a, 107b on the second semiconductor chip 205, and said one end portion (here, both ends) of the second semiconductor chip 205 extends beyond the inside surface of the recessed portion 111b and is supported on one surface of the wiring substrate 201.

This embodiment therefore exhibits the same advantages as the first embodiment.

Further according to the third embodiment, in the semiconductor device 200b the recessed portion 111b formed in the wiring substrate 201 is configured such that it extends as far as the edges on two opposing sides of the wiring substrate 201, one end portion of the second semiconductor chip 205 projecting out from the first semiconductor chip 203 toward a side other than said two sides (the sides on which the recessed portion 111b extends as far as the edge) of the wiring substrate 201.

Thus the filling properties of the sealing resin 211 into the recessed portion 111b of the wiring substrate 201 can be improved compared with the first embodiment, and the generation of voids during resin sealing can be reduced.

A fourth embodiment will now be described with reference to FIG. 14 and FIG. 15.

In the fourth embodiment, the first semiconductor chip 203 is flip-chip mounted onto the wiring substrate 201 in the first embodiment.

It should be noted that in the fourth embodiment, the same numbers are appended to elements that fulfill the same function as in the first embodiment, and the description will mainly relate to parts that differ from the first embodiment.

Figure 14:
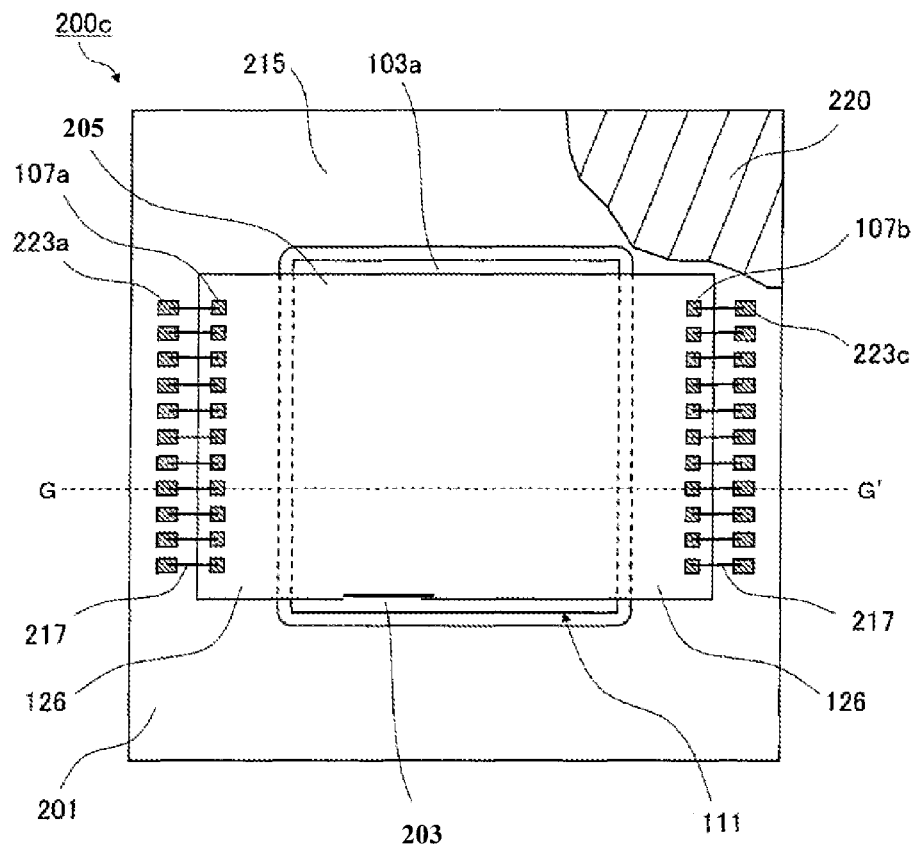
FIG. 14 is plan view illustrating a semiconductor device 200c according to a fourth embodiment, in which only a portion of the sealing body 220 is depicted.
Figure 15:
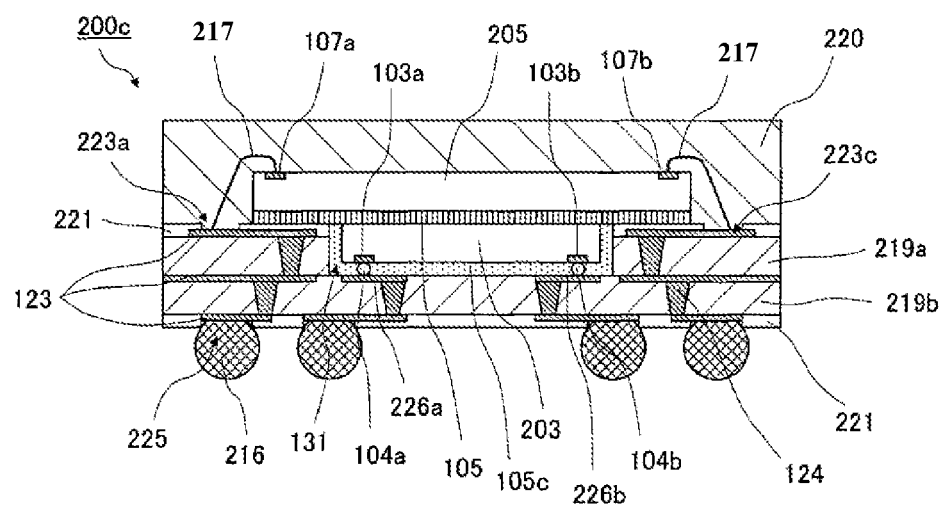
FIG. 15 is a cross-sectional view through G-G' in FIG. 14.

As illustrated in FIG. 14 and FIG. 15, in a semiconductor device 200c according to the fourth embodiment, bump electrodes 104a, 104b are formed on the electrode pads 103a, 103b of the first semiconductor chip 203, and the first semiconductor chip 203 is flip-chip mounted in the recessed portion 111 of the wiring substrate 201.

Further, the first semiconductor chip 203 is electrically connected by way of the bump electrodes 104a, 104b to connection pads 226a, 226b formed in the recessed portion 111.

Further, spaces between the first semiconductor chip 203 and the wiring substrate 201 are filled using an underfill material 105c, and gaps between the recessed portion 111 and the first semiconductor chip 203 are filled using the underfill material 105c.

It should be noted that the second semiconductor chip 205 is mounted by stacking on the reverse surface of the first semiconductor chip 203, with the interposition of the adhesive member 105, in such a way that the two short sides thereof overhang from the first semiconductor chip 203. Further, the configuration is such that the overhanging portions 126 of the second first semiconductor chip 205 are adhesively secured to the upper surface of the wiring substrate 201 with the interposition of the adhesive member 105.

Thus the configuration may also be such that the first semiconductor chip 203 is flip-chip mounted onto the wiring substrate 201, and by adopting such a configuration the electrical characteristics can be improved. Further, the gaps between the recessed portion 111 and the first semiconductor chip 203 are filled using the underfill material 105c, and therefore the generation of voids in the gaps during resin sealing can be suppressed.

It should be noted that the method of manufacturing the semiconductor device 200c is the same as in the first embodiment, and thus a description thereof is omitted.

Thus, according to the fourth embodiment, the semiconductor device 200c has the wiring substrate 201 having, on one surface, the recessed portion 111 and the plurality of connection pads 223a, 223b, 223c, 223d; the first semiconductor chip 203 mounted in the recessed portion 111; the second semiconductor chip 205 which has the plurality of electrode pads 107a, 107b on the obverse surface of at least one end portion thereof, and which is stacked on the first semiconductor chip 203 in such a way that at least one end portion thereof projects out from the first semiconductor chip 203; and the plurality of wires 217 which electrically connect the plurality of connection pads 223a, 223c on the wiring substrate 201 respectively to the plurality of electrode pads 107a, 107b on the second semiconductor chip 205, and said one end portion (here, both ends) of the second semiconductor chip 205 extends beyond the inside surface of the recessed portion 111 and is supported on one surface of the wiring substrate 201.

This embodiment therefore exhibits the same advantages as the first embodiment.

Further, according to the fourth embodiment, in the semiconductor device 200c the first semiconductor chip 203 is flip-chip mounted onto the wiring substrate 201.

Thus the electrical characteristics can be improved compared with the first embodiment. Further, the gaps between the recessed portion 111 and the first semiconductor chip 203 are filled using the underfill material 105c, and therefore the generation of voids in the gaps during resin sealing can be suppressed.

INDUSTRIAL APPLICABILITY

The invention devised by the inventors has been described hereinabove with reference to exemplary embodiments, but the present invention is not restricted to the abovementioned exemplary embodiments, and it goes without saying that various modifications are possible without deviating from the gist of the invention.

For example, the abovementioned embodiments describe semiconductor devices in which two semiconductor chips having the same pad arrangement are cross-stacked, but provided that the semiconductor device is one in which semiconductor chips having an overhanging portion are stacked on multiple levels, the present invention may be applied to any combination of semiconductor chips, for example a combination of memory chips and logic chips, or to chips having any pad arrangement.

Further, in the abovementioned embodiments, stacking is performed in such a way that two opposing sides of the second semiconductor chip 205 overhang from the first semiconductor chip 203, but stacking may also be performed in such a way that one side of the second semiconductor chip 205 overhangs, or in such a way that two, three or four adjacent sides overhang from the first semiconductor chip 203.

Further, the abovementioned embodiments describe cases in which the substrate (insulating substrate) of the wiring substrate 201 comprises two layers, but it may also comprise three or more layers.

This application is based upon and claims the benefit of priority from Japanese Patent Application No. 2012-202776, filed on Sep. 14, 2012, the entire disclosure of which is incorporated herein by reference.

EXPLANATION OF THE REFERENCE NUMBERS

41: Capillary
103a, 103b: Electrode pad
104a, 104b: Bump electrode
105, 105a: Adhesive member
105c: Underfill material
107a, 107b: Electrode pad
111, 111b: Recessed portion 123: Wiring layer
124: Via
126: Overhanging portion
131: Open portion
200, 200a, 200b, 200c: Semiconductor device
201: Wiring substrate
203: First semiconductor chip
205: Second semiconductor chip
211: Sealing resin
215, 217: Wire
216: Solder ball
219a, 219b: Insulating substrate
220: Sealing body
221: Insulating film
223a, 223b, 223c, 223d, 226a, 226b: Connection pad
225: Land
234: Dicing line
251: Dicing tape
300: Wiring mother substrate
301: Product-forming portion
400: Molding device
401: Upper die
402: Lower die
403: Cavity
404: Recessed portion
405: Gate portion
406: Resin tablet
408: Plunger
409: Runner portion
410: Cull portion

What is claimed is:

1. A semiconductor device having:
a wiring substrate having, on one surface, a recessed portion and a plurality of connection pads;
a first semiconductor chip mounted in the recessed portion by a first adhesive member, wherein gaps between the recessed portion and the first semiconductor chip are filled with the first adhesive member;
a second semiconductor chip which has a plurality of electrode pads on an obverse surface of at least one end portion thereof, and which is stacked on the first semiconductor chip in such a way that at least one end portion thereof projects out from the first semiconductor chip, and at least one end portion of the first semiconductor chip projects out from the second semiconductor chip; and
a plurality of wires which electrically connect the plurality of connection pads on the wiring substrate respectively to the plurality of electrode pads on the second semiconductor chip;
wherein the one end portion of the second semiconductor chip extends beyond an inside surface of the recessed portion and is supported on the one surface of the wiring substrate, and the second semiconductor chip is secured to the one surface of the wiring substrate and a surface of the first semiconductor chip by a second adhesive member.

2. The semiconductor device of claim 1, wherein the wiring substrate has:
a lower substrate layer; and
an upper substrate layer stacked on the lower substrate layer;
wherein, the upper substrate layer has an open portion or a groove portion corresponding to the planar shape of the first semiconductor chip, and the recessed portion comprises the lower substrate layer and the open portion or the groove portion.

3. The semiconductor device of claim 1, wherein the recessed portion is filled with the first adhesive member.

4. The semiconductor device of claim 1, having a sealing body made of resin, formed on the wiring substrate in such a way as to cover the first semiconductor chip and the second semiconductor chip.

5. The semiconductor device of claim 1, wherein the recessed portion extends as far as edges on two opposing sides of the wiring substrate, and wherein the configuration is such that the one end portion of the second semiconductor chip projects out from the first semiconductor chip toward a side other than the one surface of the wiring substrate.

6. The semiconductor device of claim 1, wherein the first semiconductor chip is flip-chip connected to the wiring substrate.

* * * * *